(12) United States Patent
Adams et al.

(10) Patent No.: US 7,311,558 B2
(45) Date of Patent: *Dec. 25, 2007

(54) RECEPTACLE AND PLUG THEREFOR (75) Inventors: Jason O. Adams, Emmaus, PA (US); Robert Paul Stocker, Bethlehem, PA (US); Joel S. Spira, Coopersburg, PA (US); Robin C. Moseley, Macungie, PA (US); Robert C. Newman, Jr., Emmaus, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 26 days.

This patent is subject to a terminal disclaimer.

(21) Appl. No.: 10/970,219

(22) Filed: Oct. 21, 2004

(65) Prior Publication Data
US 2005/0054243 A1 Mar. 10, 2005

Related U.S. Application Data (62) Division of application No. 10/698,187, filed on Oct. 31, 2003, now Pat. No. 7,198,523.

(60) Provisional application No. 60/422,993, filed on Nov. 1, 2002, provisional application No. 60/468,218, filed on May 6, 2003.

(51) Int. Cl.
*H01R 13/64* (2006.01)
(52) U.S. Cl. ........................ 439/680; 439/692
(58) Field of Classification Search ............ 439/677, 439/680, 682, 692
See application file for complete search history.

(56) References Cited

U.S. PATENT DOCUMENTS

| 4,293,733 A | 10/1981 | Royer | 174/67 |
| 4,403,824 A | 9/1983 | Scott | 439/680 |
| 4,583,799 A | 4/1986 | Wiley | 439/106 |
| 4,775,802 A | 10/1988 | Dods | 307/147 |

(Continued)

FOREIGN PATENT DOCUMENTS

DE 490 086 C 1/1930

(Continued)

OTHER PUBLICATIONS

"NEMA Plug Configurations"; Grainger® Catalogue, WW Grainger, Inc., 1 page, undated.

*Primary Examiner*—Thanh-Tam Le
(74) *Attorney, Agent, or Firm*—Drinker Biddle & Reath LLP (57) ABSTRACT

An electrical receptacle defines a receptacle formation of a mating formation pair to prevent a standard plug from establishing electrical connection while permitting an otherwise standard plug defining a corresponding plug formation to be sufficiently inserted to establish an electrical connection. The mating formation pair may include a projection on the receptacle adapted for receipt by a corresponding recess on a compatible plug. Alternatively, the mating formation pair is defined by an opening of the receptacle and a conductor of the plug, each having a cross-sectional height that is reduced from that of a standard receptacle and plug. The mating formation pair is particularly desirable for installation including a receptacle controlled by a dimmer to prevent electrical connection by a standard plug connected to a non-dimmable electrical load.

10 Claims, 11 Drawing Sheets

U.S. PATENT DOCUMENTS

| | | | |
|---|---|---|---|
| 5,045,833 A * | 9/1991 | Smith | 340/332 |
| 5,454,729 A * | 10/1995 | Wen-Te | 439/357 |
| 5,476,396 A * | 12/1995 | De Castro | 439/692 |
| 5,601,455 A | 2/1997 | Bagga | 439/650 |
| 5,670,847 A * | 9/1997 | Lin | 315/185 S |
| 5,785,551 A | 7/1998 | Libby | 439/535 |
| 6,120,320 A | 9/2000 | Veiga | 439/538 |
| 6,227,883 B1 * | 5/2001 | Lee et al. | 439/106 |
| 6,468,095 B2 * | 10/2002 | Kerr et al. | 439/140 |
| 6,592,392 B2 * | 7/2003 | Po-Heng | 439/358 |
| 6,674,003 B1 | 1/2004 | Torres | 174/66 |

FOREIGN PATENT DOCUMENTS

| | | |
|---|---|---|
| DE | 94 06 135 C | 9/1994 |
| JP | 05 65081 U | 8/1993 |

\* cited by examiner

RECEPTACLE AND PLUG THEREFOR

CROSS-REFERENCE TO RELATED APPLICATIONS

This is a divisional of application Ser. No. 10/698,187, filed Oct. 31, 2003, now U.S. Pat. No. 7,198,523 which claimed priority of U.S. Provisional Patent Application Nos. 60/422,993, filed Nov. 1, 2002 and 60/468,218 filed May 6, 2003, which are incorporated herein by reference in their entirety.

FIELD OF THE INVENTION

The present invention relates to electrical receptacles for delivering current to an electrical load from a power supply. More particularly, the present invention relates to mating plug and receptacle formations for preventing electrical connection between the receptacle and a standard plug.

BACKGROUND OF THE INVENTION

It is known to adjust the brightness of an electric light by means of a dimmer. Dimmers supplied by AC power commonly use a triac or similar semiconductor device, which limits delivered current by switching on for a portion of each half cycle of the AC supply.

In residential applications, a dimmer for lighting is often in the same unit as an on-off switch for the lighting. Examples of such combined switches and dimmers are the "Skylark" S 600 and S 600P dimmers sold by Lutron Electronics Co., Inc., of Coopersburg, Pa. The Skylark S 600 dimmer has a dimming control slider that switches the power off at the low-power end of its travel. The Skylark S 600P dimmer has a dimmer slider and a separate on-off switch. Both of the Skylark dimmer switches are designed to fit within a standard single-gang switch wall-box. They can thus be directly substituted for a standard light-switch.

It is also known in residential installations for a lighting wall-switch to control one or more electrical receptacles, so that floor or table lamps can be plugged into the receptacles and controlled by the wall-switch. Switch controlled receptacles are usually standard 110-volt receptacles adapted to receive standard 110-volt plugs. Such a construction provides for alternative control of a lamp plugged into a 110-volt power receptacle from either a wall-mounted switch or a switch provided by the lamp itself.

Control of a standard receptacle by a lighting dimmer, however, could have undesirable results. In the United States, the standard electrical receptacle used in residential applications is nominally capable of supplying 15 amps at 110 volts, which is equivalent to 1.65 kilowatts. A typical lighting dimmer is not designed to handle such power. For example, the above-mentioned Skylark models of Lutron Electronics Co., Inc. are rated for a maximum load of 600 watts. If a power load connected to a dimmer were to draw more than the rated capacity for the dimmer, the dimmer could be damaged.

Moreover, restricted electrical voltage supplied to a motor load connected to a dimmer-controlled receptacle could lead to motor stalling. Some motors designed for a 110-volt power supply, for example, may stall if the voltage drops below even 100 volts. An electric motor that remains stalled for a long period of time with even a small amount of current flowing through it could overheat, potentially starting a fire.

Receptacle units having two receptacles within a common housing are known. It is also known to install these double receptacle units such that a wall-mounted switch controls only one of the receptacles. Each of the receptacles, however, typically include identical openings for receipt of a standard plug. The receptacles, therefore, provide no indication to a potential user that given receptacle is controlled by a switch. Consequently, it would be easy for a user to inadvertently plug a 15 amp motor load, or other load that might overload the dimmer or might be damaged by the reduced (dimmed) voltage, into a receptacle controlled by a switch.

Dimmer control of a wall-mounted receptacle would desirably provide for control of a dimmable lamp plugged into the receptacle. In commercial and large residential applications, a lighting dimmer is often located in a remote location, such as an electrical closet or basement. These dimmers often control lighting in large spaces, which can include permanently installed lamps. Even in such settings, however, the ability to dim lamps plugged into wall-mounted receptacles might be desired.

Although desirable, the above-described consequences associated with dimmer control of a standard receptacle render such an installation inadvisable. The 2002 edition of the U.S. National Electrical Code, Article 404.14(E), permits dimmers to be used only where the lights are permanently wired to the dimmer, and not where they are plugged into a receptacle.

SUMMARY OF THE INVENTION

It is an object of the invention to provide a system for mating an electrical receptacle to a corresponding plug such that standard plugs are prevented from establishing an electrical connection with the receptacle while mated plugs are permitted to establish an electrical connection.

According to the present invention, the receptacle defines a receptacle formation of a mating formation pair. The receptacle formation corresponds to a plug formation of the mating formation pair, which is defined by a compatible plug. The receptacle formation of the receptacle formation pair prevents a standard plug from establishing an electrical connection with the receptacle. The receptacle formation, however, permits an otherwise standard plug that defines the plug formation of the mating formation pair to be inserted into the receptacle by an amount sufficient to establish an electric connection.

According to one embodiment, the receptacle formation of the mating formation pair is defined by a projection and the corresponding plug formation of the mating formation pair is defined by a recess formed in the plug. The receptacle includes first and second electrical contacts and first and second openings providing access to the electrical contacts. Preferably, the projection is located between the first and second openings. Preferably, the projection extends to a distance from the openings in a middle portion of the projection that is greater than that for end portions located on opposite sides of the middle portion such that the projection is substantially convex.

According to another embodiment, the receptacle formation of the mating receptacle pair is defined by one of the openings of the receptacle and the corresponding plug formation of the mating formation pair is defined by a conductor of a compatible plug. One of the openings of the receptacle defines a cross sectional dimension that is reduced with respect to the corresponding opening of a standard receptacle. A conductor of a compatible plug defines a corresponding cross sectional dimension that is reduced with respect to a standard plug such that a standard plug will be prevented from establishing an electrical connection with the receptacle. Insertion of an otherwise standard plug, however, including a conductor defining the corresponding plug formation of the mating formation pair by an amount sufficient to establish an electrical connection with the receptacle, is permitted.

Preferably, the receptacle opening and plug conductor respectively defining the receptacle formation and plug formation form the hot opening and hot conductor of the receptacle and a compatible plug. The term "hot" as used herein is meant to refer to a receptacle contact, or the corresponding conductor of a compatible plug, that will be electrically connected to a voltage source potential substantially higher than that of a grounded conductor when the plug is inserted into the receptacle. Preferably, the first and second openings of the receptacle define a height and a width adapted for receiving a corresponding blade of a compatible plug that also defines a height and a width. Preferably the receptacle opening and plug blade respectively defining the receptacle formation and plug formation of the mating formation pair define a height that is reduced with respect to that for a standard receptacle and plug.

According to one preferred embodiment of the invention, a receptacle defining a receptacle formation of a mating formation pair is connected to a dimmer for control of the receptacle by the dimmer. The inclusion of the receptacle formation for the receptacle prevents a user from establishing electrical connection between a standard plug connected to a non-dimmable load into the receptacle controlled by the dimmer. The receptacle controlled by the dimmer may be included in a receptacle unit that also includes a standard receptacle that is not controlled by a dimmer.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown. In the drawings.

DETAILED DESCRIPTION OF THE DRAWINGS

Referring to the drawings, wherein like numerals refer to like elements, there is shown in FIGS. 1 through 4 a plug 20 and a receptacle unit 22 according to the present invention. As will be described in greater detail, at least one receptacle of the receptacle unit is adapted to prevent electrical connection with a standard plug while permitting a plug that is correspondingly adapted to be inserted into the receptacle by an amount sufficient to establish electrical connection.

The mating plug and receptacle formations of the present invention desirably provide for connection of a dimmable load, such as a lamp, to a dimmer controlled receptacle while preventing connection of a standard plug of a non-dimmable load. The term non-dimmable load is meant to refer to loads such as a motor load or other loads that might overload the dimmer or potentially be damaged by dimmed (reduced) voltage. The term "dimmed" is sometimes hereinafter used to identify a plug or receptacle according to the present invention, or an element or elements thereof, to distinguish them from a standard plug or receptacle. It should be understood, however, that the plug and receptacle formations of the present invention are not limited in application to receptacles controlled by a dimmer.

Figure 1:
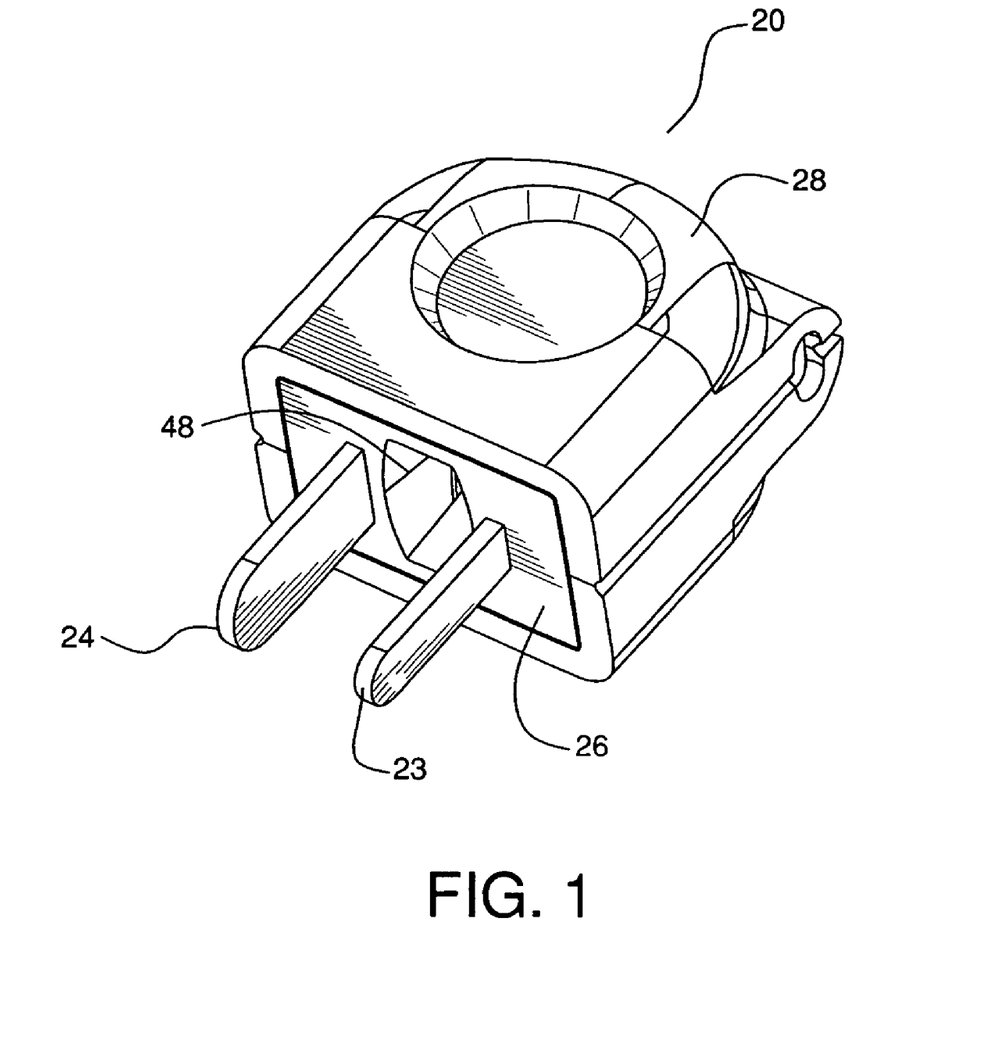
FIG. 1 is a perspective view of a plug according to the present invention.

The plug 20 comprises two metal blades 23, 24 projecting from a front face 26 of a body 28, which is preferably molded from a plastic material. A flexible electrical cord 30 extends from a rear part of the body 28. The electrical cord 30 comprises two insulated conductors 32, each of which is connected within the body 28 to a respective one of the blades 23, 24. Additionally, the electric cord 30 and body 28 can be molded as a single integrated unit or provided as separate components as would be typically used in retrofit case. Electric cords for plugs are well known and no further description is required. The blades 23, 24 of plug 20 respectively form the hot and neutral conductors for the plug. Although the preferred construction shown in the drawings includes hot and neutral plug conductors that are flat blades, the invention could also be applied to mate receptacles to plugs having hot and neutral conductors with other shapes. These could include, for example, D- or U-shaped conductors of NEMA 5-15, or square, circular, L- or T-shaped conductors.

Figure 2:
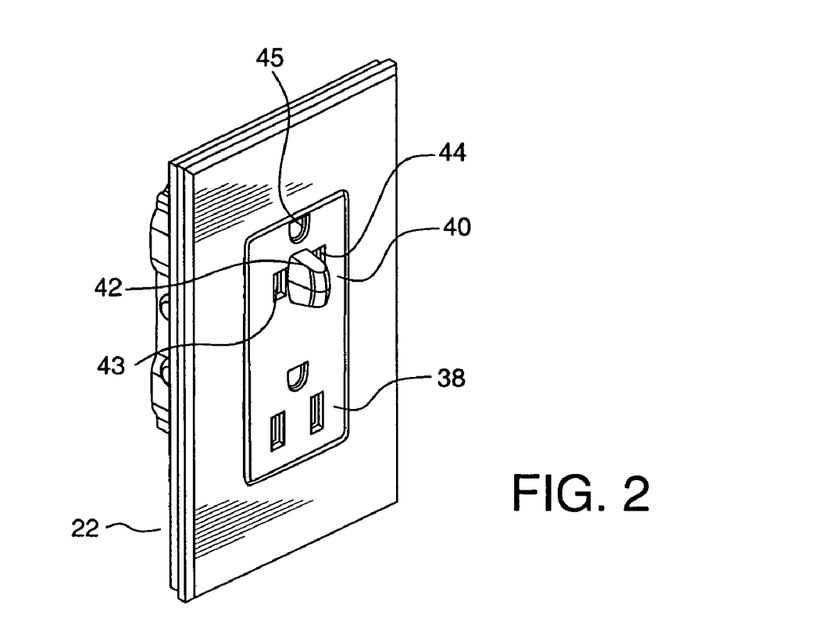
FIG. 2 is a perspective view of a wall-mounted receptacle unit according to the present invention.
Figure 3:
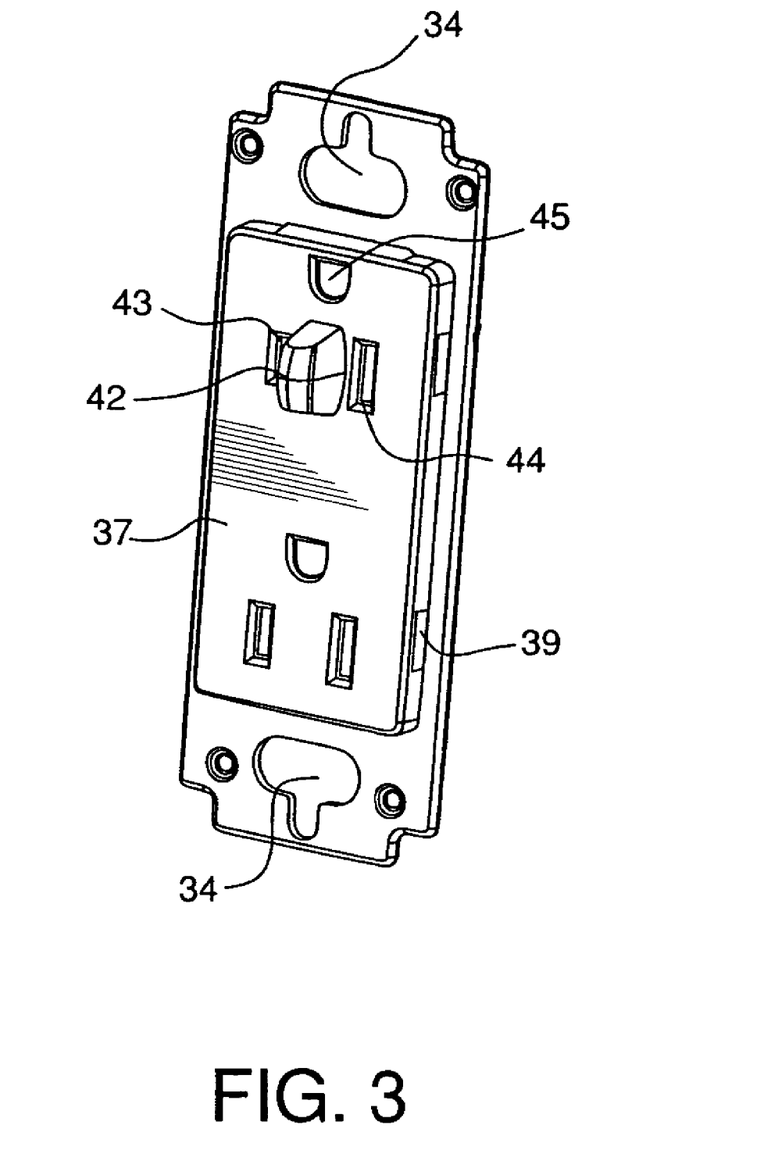
FIG. 3 is a perspective view showing a faceplate according to the present invention.
Figure 6:
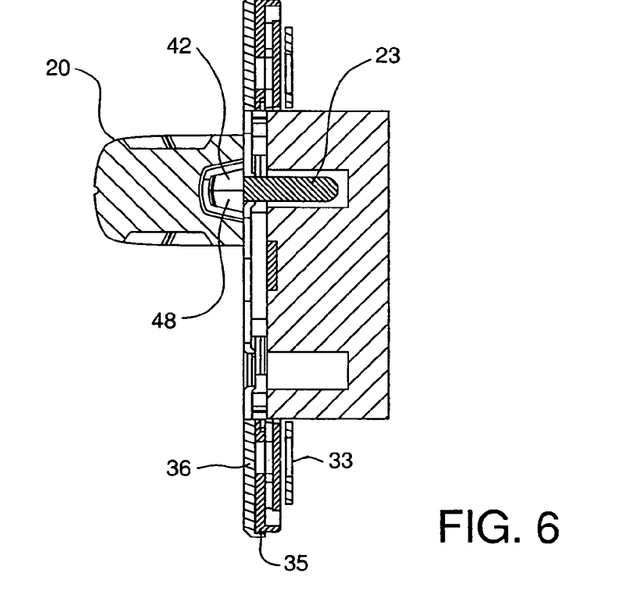
FIG. 6 is a sectional view taken along line 6-6 in FIG. 5.
Figure 7:
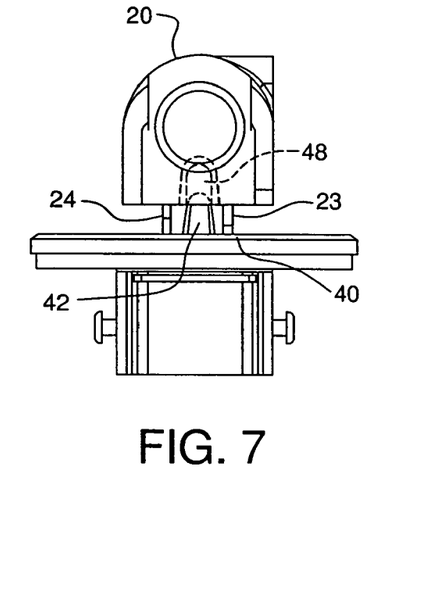
FIG. 7 is a top plan view of a plug and receptacle according to the present invention.

As may be seen in FIGS. 2, 3 and 6, the receptacle unit 22 is adapted for flush mounting. The receptacle unit 22 is carried on a metal yoke 33, provided with apertures 34 for mounting screws to attach it to a conventional wall-box. The yoke is then covered by an intermediate plate 35 (see FIG. 6), which may be screwed onto the yoke 33 with flush-mounted screws (not shown). A visible wall plate 36 then snaps onto the front of the intermediate plate 35, covering the mounting screws, and providing a finished fixture with no visible fastenings. As shown in FIG. 3, a face plate 37 is snap-fit into the front of the yoke 33. The face plate 37 is received in central openings in the intermediate plate 35 and the wall plate 36, and its front surface is flush with that of the wall plate 36. If the face plate 37 is to be removable, the snap fastenings may be accessible from the sides, as shown at 39 in FIG. 3, when the intermediate plate 35 and the wall plate 36 are removed.

Figure 5:
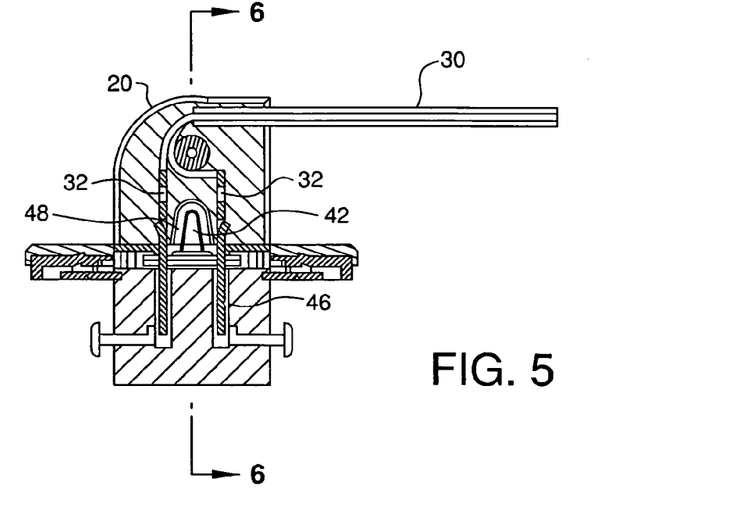
FIG. 5 is a sectional view taken along line 5-5 in FIG. 4.

The receptacle unit 22 is a double-receptacle unit. One receptacle 38 of the unit 22 is a standard 110-volt, 15 amp, grounded receptacle in accordance with U.S. ANSI/NEMA standard WD 6-2002, sheet 5-15 ("NEMA 5-15"). The other receptacle 40 incorporates receptacle formations of mating formation pairs, described below, that correspond with plug formations of the plug 20 to prevent electrical connection by a standard plug to the receptacle. The receptacle 40 will sometimes hereinafter be referred to as the dimmed receptacle to distinguish it from a standard receptacle. The dimmed receptacle 40 includes openings 43, 44, 45 and contacts 46 (best seen in FIG. 5). The openings 44, 45 correspond to the hot and neutral blades 23, 24 of the dimmed plug 20.

The dimmed receptacle 40 and the dimmed plug 20 incorporate corresponding receptacle and plug formations of mating formation pairs to permit the dimmed plug to make electrical connection with the dimmed receptacle while preventing a standard plug from doing so. It should be noted, however, that the dimmed plug and receptacle are otherwise standard in configuration. This construction desirably provides a user with the option of connecting the dimmed plug to either the dimmed receptacle 40 or to a standard receptacle, such as receptacle 38 of unit 22 for example. A first mating formation pair incorporates a projection 42 located on the dimmed receptacle 40 that corresponds to a recess 48 on the dimmed plug 20. A second mating formation pair is provided by forming one of the blades of the dimmed plug 20, and a corresponding one of the openings of the dimmed receptacle 40, to have a cross-sectional dimension that is reduced with respect to corresponding dimensions of a standard plug and receptacle.

As shown in FIGS. 2 and 3, the projection 42 of the first mating formation pair is located on the receptacle unit 22 between the hot and neutral openings 43, 44 of the dimmed receptacle 40. The projection 42 is made of electrically non-conductive material. The projection 42 may be integrally formed with the receptacle 40 in a molded plastic process for example. Alternatively, the projection 42 could be defined by a separate element received by the receptacle unit 22. As shown, the projection 42 is convex such that it extends to a distance from faceplate 37 in a middle portion of the projection 42 that is greater than that for end portions of the projection 42 located on opposite sides of the middle portion. It is not functionally necessary to have the projection 42 extend to the same distance along the entire height of the projection 42, provided that the receptacle openings 43, 44 are properly shaped to prevent the plug from being inserted obliquely. The rounded configuration of the projection 42 desirably limits damage that could otherwise result from contact with passing people or objects if the projection included square-cornered end portions.

Figure 4:
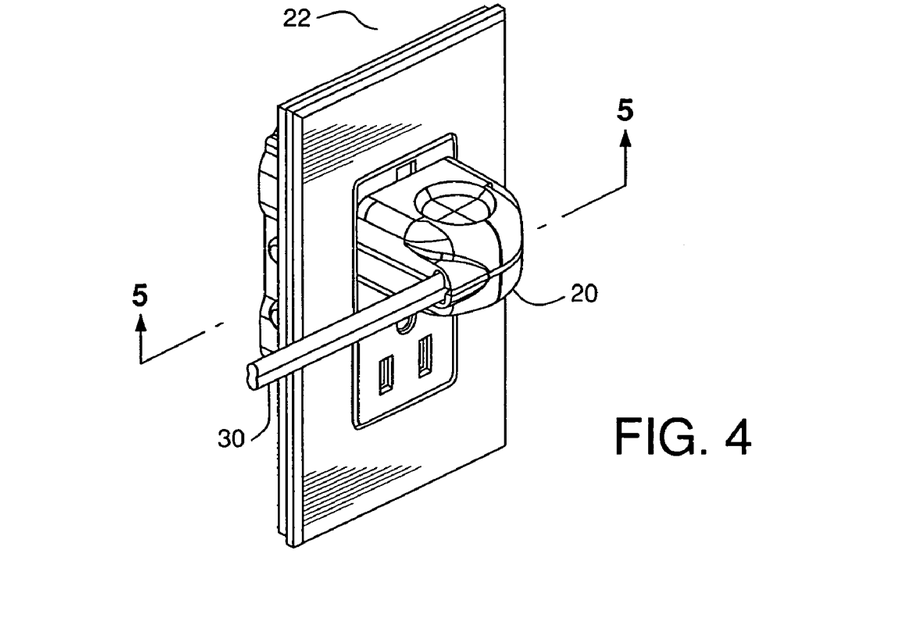
FIG. 4 is a perspective view of the receptacle of FIG. 2 showing the plug of FIG. 1 inserted into one of the receptacles of the receptacle unit.

The recess 48 of the dimmed plug 20, that defines the plug formation of the first mating formation pair, is formed in the front face 26 of the plug. The recess 48 is preferably, although not necessarily, molded into the plastic material of the plug 20. The recess 48 does not expose or interfere with any electrically conductive parts of the plug. As shown in FIGS. 4 to 7, the recess 48 aligns with, and is dimensioned to receive, the projection 42. Thus, when the plug 20 is inserted into the receptacle 40, it can be fully inserted until the front face 26 of the plug meets the faceplate 37 of the receptacle. In that relative position, which is shown in FIG. 4, the hot and neutral blades 23, 24 of the dimmed plug 20 contact the hot and neutral contacts 46 in the dimmed receptacle, establishing an electrical connection between the receptacle and the plug.

As described above, the dimmed receptacle 22 and the dimmed plug 20 also incorporate a second mating formation pair. As shown in the drawings, the configuration of the neutral blade 24 of dimmed plug 20 complies with U.S. ANSI/NEMA standard WD 6-2002, sheet 1-15 ("NEMA 1-15") for 110 volt, 15 amp, 2-wire plugs. That is to say, neutral blade 24 has a length that is between 0.625 and 0.718 inches, a height that is between 0.307 and 0.322 inches, and a width that is approximately 0.060 inches. The hot blade for a NEMA standard plug has a height that is between 0.240 and 0.260 inches. The height of the hot blade 23 of the dimmed plug 20 is reduced from the standard to a height of between approximately 0.187 to 0.197 inches.

The corresponding hot opening 43 of the dimmed receptacle 40 has a height that is between approximately 0.202 to 0.212 inches. This is reduced from that of a NEMA standard receptacle, which is between 0.265 to 0.285 inches. The neutral opening 44 and ground opening 45 of the dimmed receptacle 40 are preferably similar to that of a NEMA standard receptacle. The width and length of the hot blade 23 of dimmed plug 20 is approximately equal to the width and length of the neutral blade 24.

The construction of the hot blade 23 of the dimmed plug 20 and the hot opening 43 of the dimmed receptacle, therefore, prevents the corresponding hot blade of a standard plug from being inserted into the hot opening 43 of the dimmed receptacle 40.

Each of the receptacles 38, 40 provides openings for a ground pin, but the plug 20 is shown as a two-blade plug. The use of the two-bladed dimmed plug 20 with the three-opening receptacle 40 is acceptable because, as will be explained below, the receptacle 40 will be used only for those lighting loads for which a 2-bladed plug and receptacle, without a ground connection, would be proper. As shown in FIG. 4, the corresponding blade and opening formations of the second mating formation pair permits insertion of the blades 23, 24 of the dimmed plug 20 into the hot and neutral openings 43, 44 of the dimmed receptacle.

It will be understood that in other circumstances or in other countries, a different configuration of blades on the plug, and corresponding openings in the receptacle, might be provided in accordance with the present invention. Except for the formations of the first and second mating formation pairs, the dimmed plug 20 and the dimmed receptacle 40 are otherwise standard in configuration, as mentioned above. This ensures that the dimmed plug 20 can be used to make electrical connection with either the dimmed receptacle 40 or the standard receptacle 38 and that the received plug will be retained within the receptacle in a similar fashion as a standard plug received in a standard receptacle.

The use of the hot blade 23 and hot opening 43 to define the formations of the second mating formation pair, rather than the neutral blade 24 and opening 44, provides an additional advantage. As long as both blades are prevented from making electrical contact it is not critical which one of the openings 43, 44 defines the obstruction. However, if there is any possibility of the non-excluded blade making contact, it is preferable that it be the hot contact of the dimmed receptacle 40 that is rendered inaccessible by the receptacle formation.

Figure 8A:
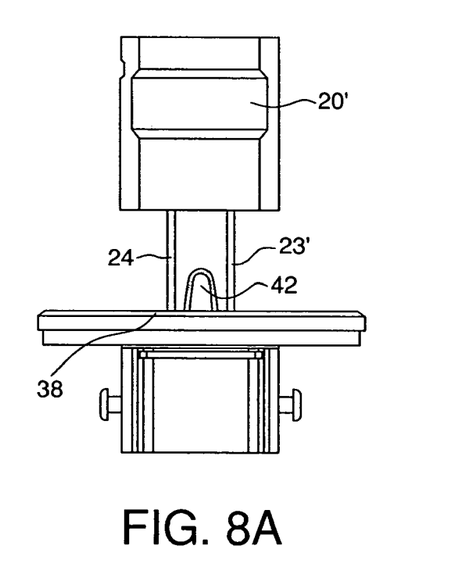
FIG. 8A is a side elevation view, partly in section, showing attempted insertion of a standard plug into the receptacle of FIG. 2 in which the insertion of the hot blade of the standard plug is prevented by the corresponding opening of the receptacle.
Figure 8B:
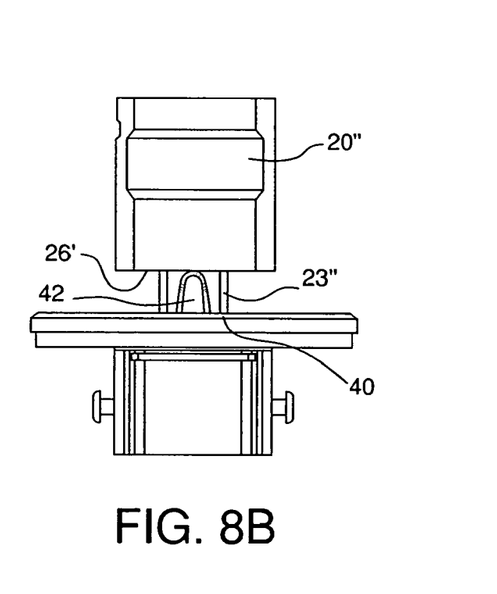
FIG. 8B is a side elevation view, partly in section, showing attempted insertion of a plug into the receptacle of FIG. 2, the plug including a hot blade that is reduced in height from that of a standard plug.

Referring to FIGS. 8A and 8B, the operation of the receptacle formations of the mating formation pairs to limit insertion of a non-corresponding plug into dimmed receptacle 40 is illustrated. As shown in FIG. 8A, attempted insertion of a standard NEMA 1-15 plug 20' into the dimmed receptacle 40 is prevented because the hot blade 23' of the standard plug will not fit into the hot opening 43 of the dimmed receptacle 40 (FIG. 2).

FIG. 8B illustrates attempted insertion into dimmed receptacle 40 of an otherwise standard NEMA 1-15 plug 20" having a hot blade 23" sufficiently reduced in height to permit insertion of the hot blade into the hot opening 43. Full insertion of the plug 20" into the dimmed receptacle 40, however, is prevented by contact between the projection 42 of the first mating formation pair and the front face 26" of the plug 20". Provided that the projection 42 extends from the receptacle unit 22 by a distance that is greater than an overlapping length between blades and contacts that would result if full plug insertion were permitted, the plug 20" will be prevented from establishing electrical connection with the dimmed receptacle 40. If the neutral wire of the dimmed receptacle 40 is tied to ground potential voltage, the projection 42 could conceivably be configured to permit overlap between the neutral blade of plug 20" and the corresponding contact of the dimmed receptacle 40.

If the receptacle 40 is restricted to dimmable lighting loads, or other loads that do not draw very large currents, the area of electrical contact between the blades 23, 24 and contacts of the dimmed plug 20 and dimmed receptacle 40 do not need to be very large. Consequently, the length of overlap between the beginning of the contacts 46 of dimmed receptacle 40 and the tip of the blades 23, 24 of a fully inserted dimmed plug 20 can be kept fairly small. The distance separating the top of the projection 42 and the beginning of the contacts 46 must be greater than the length of the blades of the plugs 20', 20". Thus, the height of the projection 42, which must be greater than the length of contact overlap, can also be kept fairly small.

Figure 9A:
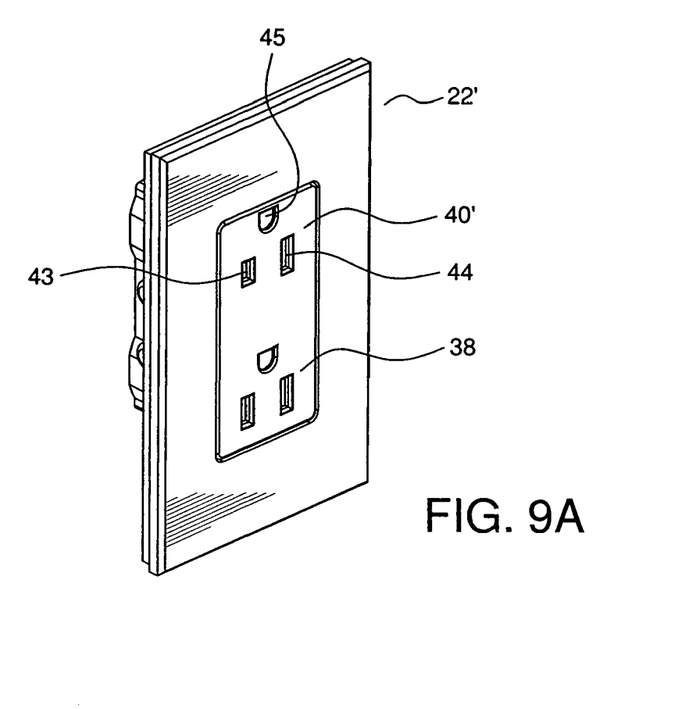
FIG. 9A is a perspective view of a receptacle unit otherwise similar to the receptacle unit of FIG. 2 that does not have a projection.
Figure 9B:
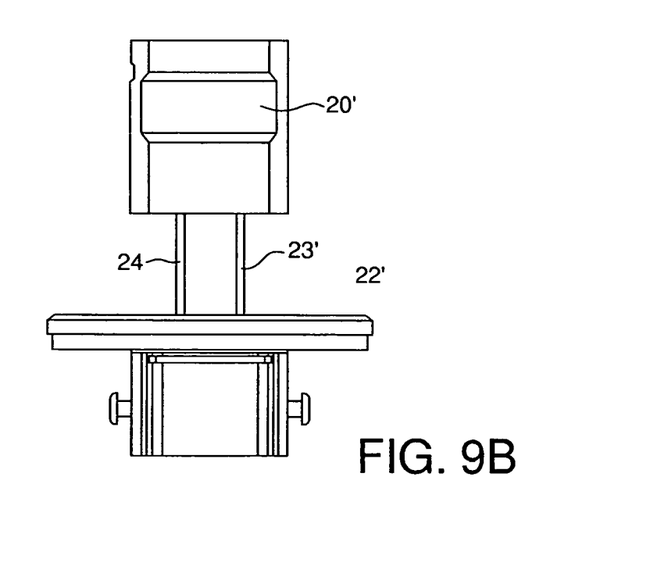
FIG. 9B is a side elevation view, partly in section, showing attempted insertion of a plug into the receptacle of FIG. 9A.
Figure 10A:
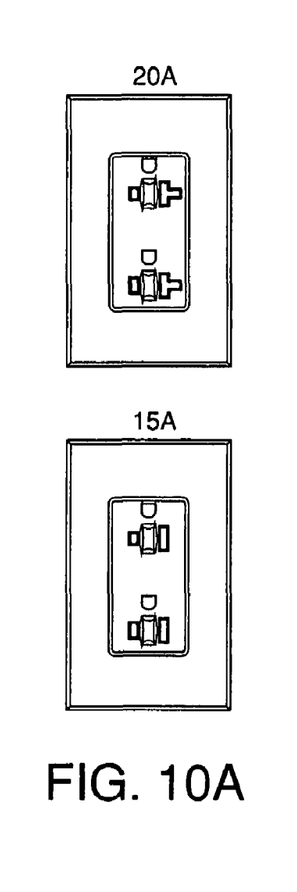
FIGS. 10A through 10D are front elevation views of receptacle units according to the present invention having varying configurations.
Figure 10B:
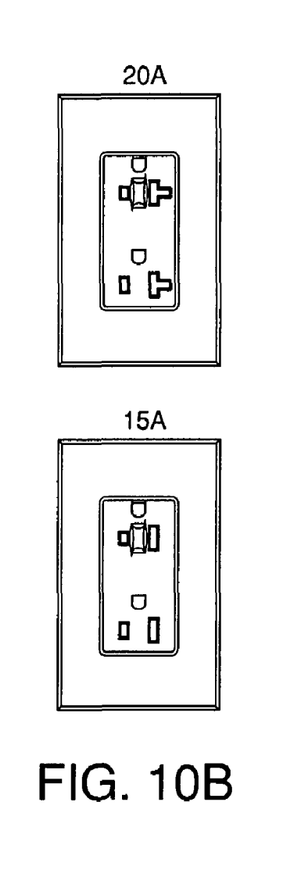
Figure 10C:
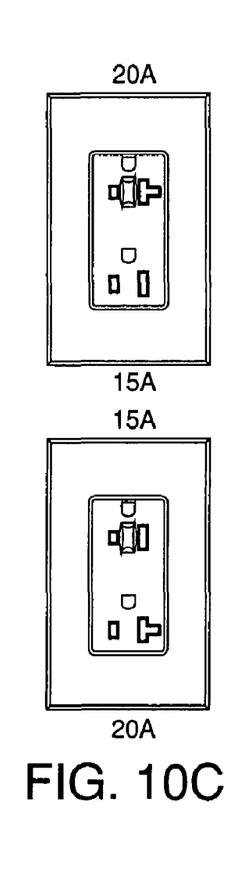
Figure 10D:
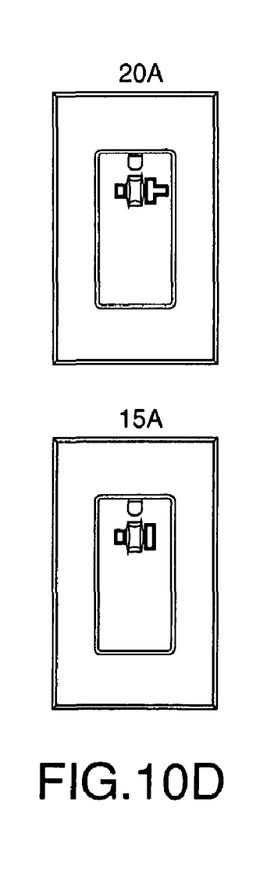
Figure 11A:
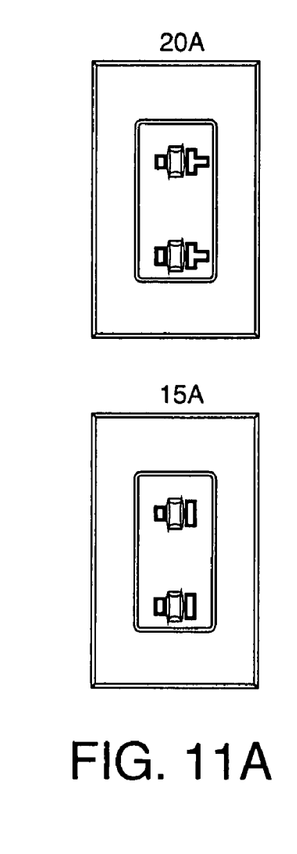
FIGS. 11A through 11D are front elevation views of receptacle units according to the present invention otherwise similar to those of FIGS. 10A through 10D having two-opening receptacles.
Figure 11B:
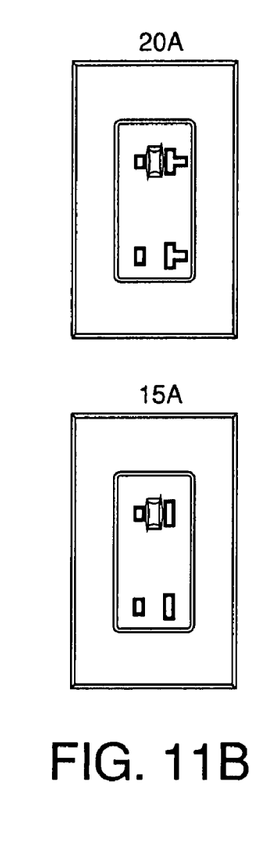
Figure 11C:
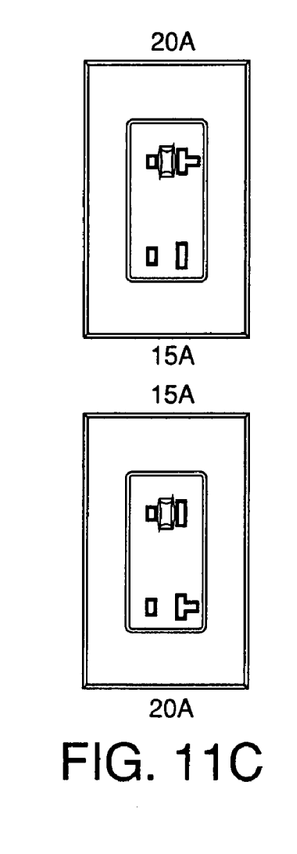
Figure 11D:
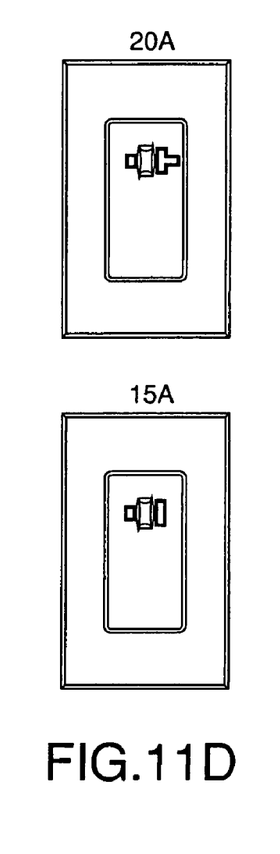

Either of the first and second mating formation pairs described above would function to limit electrical connection between a receptacle and a plug not incorporating a corresponding plug formation. Inclusion of both of the mating formation pairs provides added assurance that a non-corresponding plug will not be inserted into the dimmed receptacle 40. Both of the mating formation pairs, however, are not required. Referring to FIGS. 9A and 9B, there is illustrated an alternative receptacle unit 22' that incorporates only the second mating formation pair. The receptacle unit 22', therefore, does not include a projection as did the receptacle unit 22. The receptacle unit 22' includes a dimmed receptacle 40' that includes openings 43, 44 and 45, which are identical in configuration to the corresponding openings of the dimmed receptacle 40. The hot blade opening 43 of dimmed receptacle 40', therefore, is dimensioned to prevent insertion of the hot blade of a plug that is not correspondingly dimensioned. Referring to FIG. 9B, the attempted insertion of a plug 20' is shown. As was the case for the dimmed receptacle 40 shown in FIG. 8A, the configuration of the hot opening 43 of dimmed receptacle 40' prevents insertion of the hot blade 43 of the non-corresponding plug 20' into the hot opening 43 of dimmed receptacle 40'.

Each of the first and second mating formation pairs offers certain advantages over the other. The projection 42 of the first mating formation pair provides a more conspicuous visual indication that the dimmed receptacle will not accept a standard plug than does the second mating formation pair. The projection 42, however, may be considered unsightly and may increase the risk of contact injury to passersby, or damage to the projection 42 itself. Also, the hot opening 43 associated with the second mating formation pair serves to completely prevent insertion of the standard plug 20'. Incorporation of the projection 42 of the first mating pair without including the blade and opening configuration of the second mating pair would allow for partial insertion of an otherwise standard plug not incorporating the corresponding plug formation.

If a dimmer switch is used to control delivery of current to the dimmed receptacle 40 of the present invention, it would be connected to an appropriate lighting feed from an AC supply. Dimmer switches commonly include an on-off switch, a triac dimmer and a control unit by which a user can adjust the duty cycle of the dimmer, and can thus dim a lighting load. The dimmed voltage supply is connected to contact 46 of receptacle 40. The receptacle 40 may also be provided with a ground contact.

The flexible cord 30 attached to dimmed plug 20 could be attached to a dimmable load such as a lamp, for example. Thus, when the dimmable plug 20 is inserted into the dimmed receptacle 40, the lamp could be switched on or off by means of the switch, and dimmed by means of the dimmer and controller. Alternatively, the dimmable plug 20 could be inserted into a standard NEMA 5-15 receptacle, and operated without dimming. An on-off switch would preferably be provided on the lamp, to enable it to be switched on or off at the lamp when it is inserted into any outlet. The dimmable plug 20 could be modified to include a ground pin. However, the two-blade configuration shown in the drawings provides for insertion of the dimmable plug 20 into either NEMA 1-15 two-opening receptacles or NEMA 5-15 three-opening receptacles, with or without the projection 42.

If the dimmed receptacle 40 is a grounded NEMA 5-15 receptacle, the projection 42 that prevents general-use plugs 20', 20" from being inserted needs to be sufficiently short at the end nearer to the ground contact 45 to accommodate the ground pin of a 3-blade plug. However, the projection 42 is still be effective to prevent a general-use plug 20" from being inserted into the receptacle 40.

The present invention is not limited in application to the double-receptacle configurations shown in FIGS. 2-4 and 9A. Referring to FIGS. 10A-10D, there are shown variously configured receptacle units each including at least one receptacle incorporating both of the above-described first and second mating formation pairs. The receptacles shown in FIGS. 10A-10D are three-opening receptacles adapted for receipt of a grounded plug. The present invention, however, is not limited to receptacles adapted for receiving grounded plugs. Referring to FIGS. 11A-11D, there is shown an otherwise similar series of receptacle units to those shown in FIGS. 10A-10D having receptacles that are adapted only for receipt of two-bladed plugs.

Figure 12:
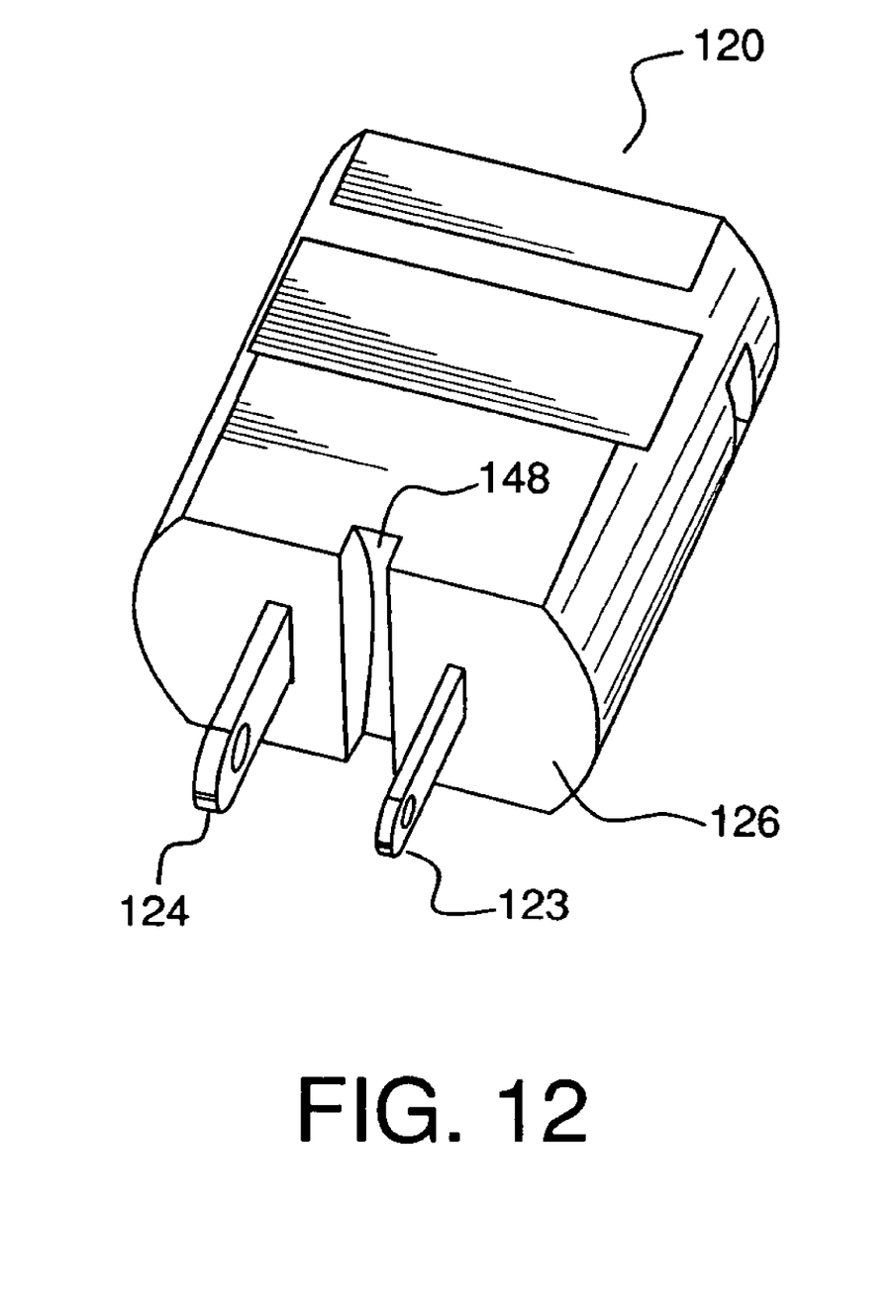
FIG. 12 is a perspective view of a plug according to the present invention.
Figure 13:
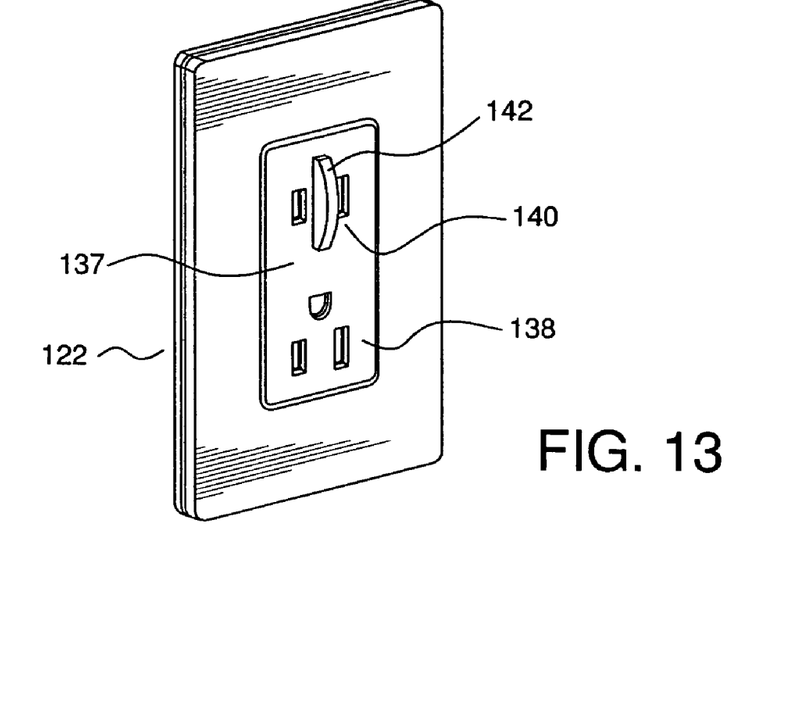
FIG. 13 is a perspective view of a receptacle unit according to the present invention corresponding to the plug of FIG. 12.
Figure 14:
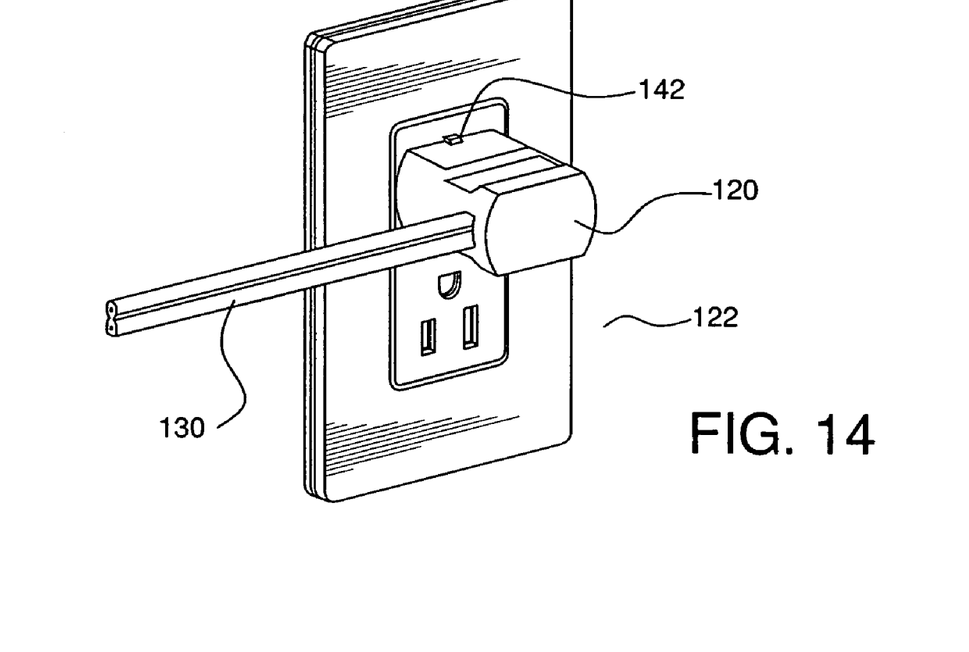
FIG. 14 is a perspective view showing the plug of FIG. 13 inserted into a receptacle of the receptacle unit of FIG. 12.

Referring now to FIGS. 12 through 14, there is shown an alternate embodiment including a dimmed plug 120 and a receptacle unit 122 having a dimmed receptacle 140. The dimmed plug 120 and dimmed receptacle 140 respectively include a recess 148 and projection 142. In a similar manner as plug 20 and receptacle 40, described above, the recess 148 and projection 142 correspond to prevent insertion of a standard plug into the dimmed receptacle 140 by an amount sufficient to establish electrical connection while permitting such insertion by the dimmed plug 120. The recess 148 formed in the front face 126 of the dimmed plug 120, however is elongated to extend in a direction that is substantially perpendicular to the length of the blades 123, 124 of the dimmed plug 120.

As shown in FIG. 13, receptacle unit 122 is equipped with a projection 142 that protrudes outwardly from a face plate 137 of the receptacle unit 122. As above, a standard plug would be prevented from being inserted into the dimmed receptacle 140 of unit 122. FIG. 14 shows the dimmed plug 120 inserted into the dimmed receptacle 140. The recess 148 of the dimmed plug 120 aligns with, and is dimensioned to receive, the projection 142 of the dimmed receptacle 140. Thus, when the dimmed plug 120 is received by the dimmed receptacle 140, it can be fully inserted until the front face 126 of the dimmed plug meets the face plate 137 of the dimmed receptacle 140. In that relative position, the blades 123, 124 of the dimmed plug 120 will overlap the contacts of the dimmed receptacle 140, thereby establishing an electrical connection between the receptacle and the plug. As shown, a portion of the projection 142 may be seen when the dimmed plug 120 is fully inserted into the dimmed receptacle 140. This visual indication serves to identify that the receptacle 140 is a dimmed receptacle.

Figure 15:
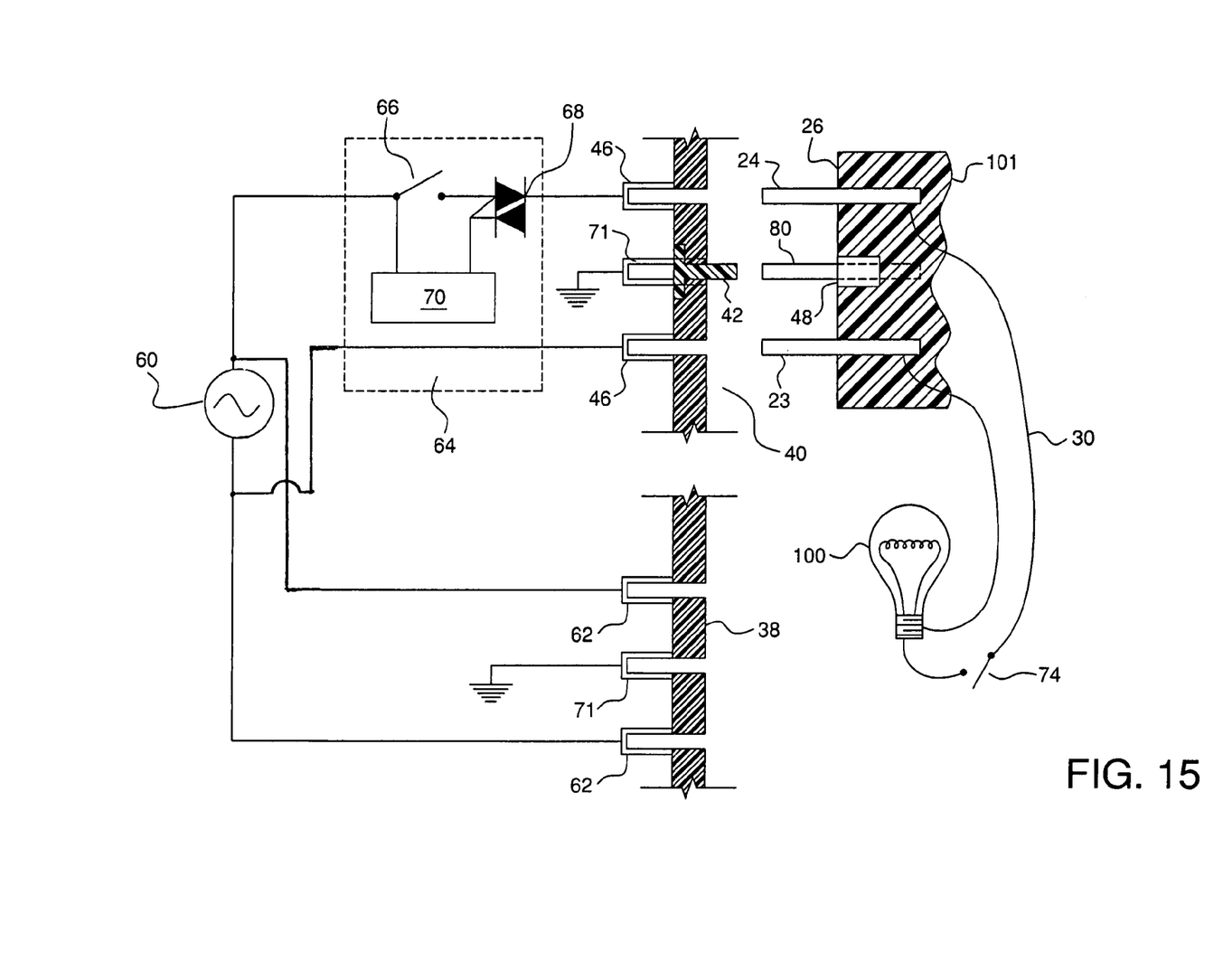
FIG. 15 is a schematic illustration of a power supply circuit.

Referring now to FIG. 15, a receptacle unit 22 according to the present invention is schematically shown connected to a source of electrical power, such as an ordinary 110 volt AC house wiring supply 60. It will be understood that the AC supply 60 includes the usual distribution board, circuit breakers, and the like. The contacts 62 of the standard receptacle 38 may be connected directly to an appropriate power feed from the AC supply 60, and to ground 71.

A dimmer switch indicated generally by the reference numeral 64 is connected to an appropriate lighting feed from the AC supply 60. The dimmer switch 64 includes an on-off switch 66, a triac dimmer 68, and a control unit 70 by which a user can adjust the duty cycle of the dimmer, and can thus dim a lighting load. The dimmed output from the dimmer switch 64 is connected to the contacts 46 of the dimmed receptacle 40. As shown in FIG. 15, the dimmed receptacle 40 may also be provided with a ground contact 71.

A dimmed plug 101 is connected by the flexible lead 30 to a dimmable lighting load such as a lamp 100. Thus, when the dimmed plug 101 is inserted into the dimmed receptacle 40, the lamp 100 can be switched on or off using the switch 66, and dimmed using the triac 68 and controller 70. Alternatively, the plug 101 can be inserted into a standard NEMA 5-15 receptacle, and operated without dimming. An on-off switch 74 is preferably provided on the lamp 100, to enable it to be switched on or off when it is inserted into any outlet. The plug 101 may be provided with a ground pin 80. However, it may instead be a two-blade plug 20 as shown in FIG. 1. It can then be inserted into either NEMA 1-15 two-opening receptacles or NEMA 5-15 three-opening receptacles, with or without the projection 42.

As described above, the projection 42 provided on the receptacle unit 22 may be integrally molded. Alternatively, the projection may be defined by a separate element inserted into a pocket defined by the receptacle as illustrated in FIG. 15 for example.

If it is desired to use the receptacle 40 for general-use without the projection, the receptacle unit 22 could be adapted to provide for removal of the projection or that portion of the unit defining the projection. If the projection 42 is defined by a separate element, it may be provided with a bright or contrasting color to make it more conspicuous. The projection 42 must be thin enough to fit between the slots 44 but should desirably be sufficiently thick to prevent excessive deflection or breakage.

The projection and receptacle openings respectively defining the receptacle formations of the above-described first and second mating formation pairs have been shown and described as being provided by a separate element, such as the face plate 37 of FIG. 3 that is removable with respect to the receptacle unit 22. It should be understood, however, that the invention does not require a separate element to provide these features. The projection and receptacle openings could also be integrally formed with the main body of the receptacle unit, for example.

Although the invention has been described by reference to preferred embodiments, it will be understood that various changes may be made without departing from the spirit or scope of the invention. For example, the invention is especially advantageous when applied, as described above, to a double receptacle unit in which one receptacle is a standard power outlet and the other is a dimmed receptacle controlled by a dimmer. In that situation, the risk of a user mistakenly plugging a power load into the lighting outlet is very high. However, the invention may be equally applied to a receptacle that is not part of a double-receptacle unit.

Although the invention is particularly desirable for application to a receptacle controlled by a dimmer, it may be applied to other circumstances where a receptacle must be restricted to a particular class of loads or power supplies.

Although the invention has been described with reference to simple plugs having blades on the front that are inserted into openings in the receptacles, it may be applied in appropriate cases to plugs and receptacles having other forms of contacts especially where, as explained above, it is necessary to prevent only some of the contacts in a standard plug and a receptacle according to the invention from establishing an electrical connection. Examples of such other forms of contacts include the shrouds that provide continuity for a conducting shield or outer conductor in data transmission cables, and the ground contact on a German "Schuko" plug and receptacle.

The foregoing describes the invention in terms of embodiments foreseen by the inventor for which an enabling description was available, notwithstanding that insubstantial modifications of the invention, not presently foreseen, may nonetheless represent equivalents thereto.

What is claimed is:
1. A dimmable lighting unit for a lamp load capable of being operated from a selected one of a standard power supply or a dimmed power supply comprising:
   a plug electrically connectable to said lamp load;
   said plug adapted for insertion into a receptacle complying with an industry standard configuration for general-use plugs and receptacles, said plug further adapted to define a plug formation of a mating formation pair corresponding to a receptacle formation of said mating formation pair, said receptacle formation dimensioned to contact a general-use plug complying with said industry standard configuration and not defining said plug formation to prevent a blade of said general-use plug from contacting an electrical contact of said receptacle thereby preventing said general-use plug from establishing an electrical connection with said receptacle, said receptacle formation permitting inser- tion of the plug defining said plug formation by an amount sufficient to establish said electrical connection, wherein a full insertion of said plug defining said plug formation into said receptacle results in an overlapping contact between said contact and a first blade of said plug defining said plug formation, said overlapping contact having a length, and wherein the receptacle formation of said mating formation pair is a projection on the receptacle, the projection extending from said receptacle to a height that is greater than the length of said overlapping contact, and wherein the plug formation of said mating formation pair is a recess adapted for receipt of said projection such that said general-use plug is prevented from being inserted in said receptacle by an amount sufficient to establish said electrical connection.

2. The dimmable lighting unit according to claim 1, wherein said plug defining said plug formation includes said first blade and a second blade, said first and second blades adapted to establish electrical connection with first and second electrical contacts of said receptacle.

3. The dimmable lighting unit according to claim 2, wherein said plug defining said plug formation further comprises a grounding pin adapted to establish electrical connection with a grounding contact of said receptacle.

4. The dimmable lighting unit according to claim 2, wherein said recess is located between the first and second blades of said plug defining said plug formation.

5. The dimmable lighting unit according to claim 4, wherein the recess in said plug defining said plug formation is elongated in a direction that is perpendicular to a length of at least one of the first and second blades of said plug defining said plug formation.

6. The dimmable lighting unit according to claim 5, wherein the recess in said plug defining said plug formation includes a middle portion and end portions located on opposite sides of the middle portion and wherein the middle portion of said recess is deeper than the end portions.

7. The dimmable lighting unit according to claim 1, wherein a distance between the top of the projection and the electrical contact is greater than approximately 0.618 inches.

8. A system for providing current from a line voltage supply to an electrical load, comprising:

a receptacle adapted to be supplied with electrical current from the line voltage supply and including a first electrical contact, the receptacle defining a receptacle formation of a mating formation pair; and a plug adapted to supply current to said electrical load, the plug defining a plug formation of said mating formation pair corresponding to said receptacle formation;

the receptacle formation of said mating formation pair dimensioned to contact a general-use plug complying with an industry standard configuration and not having said plug formation to prevent a blade of said general-use plug from contacting the first electrical contact of said receptacle thereby preventing said general-use plug from establishing an electrical connection with said receptacle while permitting insertion of the plug having said plug formation and otherwise complying with said industry standard configuration into said receptacle by said amount sufficient to establish an electrical connections, wherein a full insertion of said plug defining said plug formation into said receptacle results in an overlapping contact between said first electrical contact and a blade of said plug defining said plug formation, said overlapping contact having a length, and wherein said receptacle further comprises a second electrical contact and a non-conductive face member covering said first and said second electrical contacts, the receptacle including first and second openings to permit access to said first and second electrical contacts, and wherein the receptacle formation of said mating formation pair is defined by a projection located between said first and second openings, the projection extending to a height from said receptacle that is greater than said length of said overlapping contact.

9. The system of claim 8, wherein said receptacle further comprises a grounding conductor.

10. The system according to claim 8, wherein a distance between the top of the projection and the first electrical contact is greater than approximately 0.618 inches.

* * * * *